United States Patent
Bertrand et al.

(10) Patent No.: US 10,651,330 B2
(45) Date of Patent: May 12, 2020

(54) METHOD FOR MANUFACTURING A PHOTOVOLTAIC MODULE AND PHOTOVOLTAIC MODULE THUS OBTAINED

(71) Applicant: ARMOR, Nantes (FR)

(72) Inventors: Mélanie Bertrand, Vertou (FR); François Allais, Basse Goulaine (FR); Jeremiah K. Mwaura, Andover, MA (US)

(73) Assignee: ARMOR, Nantes (FR)

( * ) Notice: Subject to any disclaimer, the term of this patent is extended or adjusted under 35 U.S.C. 154(b) by 230 days.

(21) Appl. No.: 15/843,257

(22) Filed: Dec. 15, 2017

(65) Prior Publication Data

US 2018/0175228 A1 Jun. 21, 2018

(30) Foreign Application Priority Data

Dec. 16, 2016 (FR) ..................... 16 62616

(51) Int. Cl.
*H01L 31/18* (2006.01)
*H01L 31/05* (2014.01)
*H01L 31/0465* (2014.01)

(52) U.S. Cl.
CPC ...... *H01L 31/0508* (2013.01); *H01L 31/0465* (2014.12); *H01L 31/05* (2013.01); *H01L 31/18* (2013.01); *Y02E 10/549* (2013.01)

(58) Field of Classification Search
CPC . H01L 31/0508; H01L 31/0465; H01L 31/05; H01L 31/18
See application file for complete search history.

(56) References Cited

U.S. PATENT DOCUMENTS

| | | | |
|---|---|---|---|
| 4,243,432 A | 1/1981 | Jordan et al. | |
| 4,948,436 A * | 8/1990 | Juergens | H01L 31/076 136/244 |
| 7,932,124 B2 | 4/2011 | Brabec et al. | |
| 2012/0276681 A1 | 11/2012 | Otte et al. | |
| 2014/0166094 A1 * | 6/2014 | Loscutoff | H01L 31/18 136/256 |
| 2017/0373208 A1 * | 12/2017 | Bosman | H01L 31/0392 |

FOREIGN PATENT DOCUMENTS

WO 2013/108623 A1 7/2013

OTHER PUBLICATIONS

Search Report for FR 1662616 dated Aug. 10, 2017.

* cited by examiner

*Primary Examiner* — Susan D Leong
(74) *Attorney, Agent, or Firm* — Thompson Coburn LLP; Steven M. Ritchey

(57) ABSTRACT

The present invention relates to a method for manufacturing a photovoltaic module (10), comprising the following steps: forming, on an electrically conducting material, a furrow (20A) defining a first (18A) and second (18B) lower electrode; then forming, on each lower electrode, a stack (34) comprising at least one upper electrode (36) and an intermediate photo-active layer (38), to form a first (16A) and second (16B) photovoltaic cell, respectively; then forming an electrical connection (17A) between said cells (16A, 16B).
Before the stacks, the following are formed: a first insulating strip (22A) in the furrow (20A); and a second electrically insulating strip (24B) on the second lower electrode, delimiting an inactive area (28B) on said second electrode. The stack (34) next formed on the second cell is positioned outside the inactive area.

10 Claims, 1 Drawing Sheet

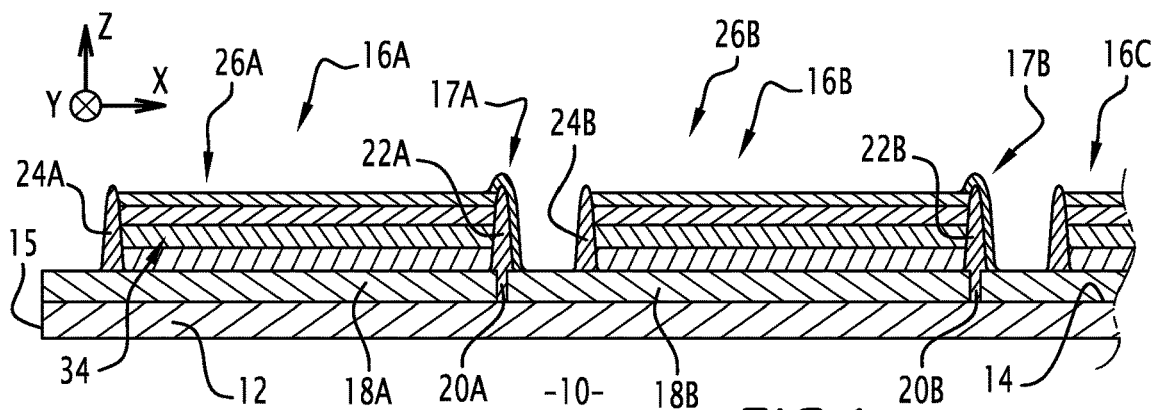
FIG.1
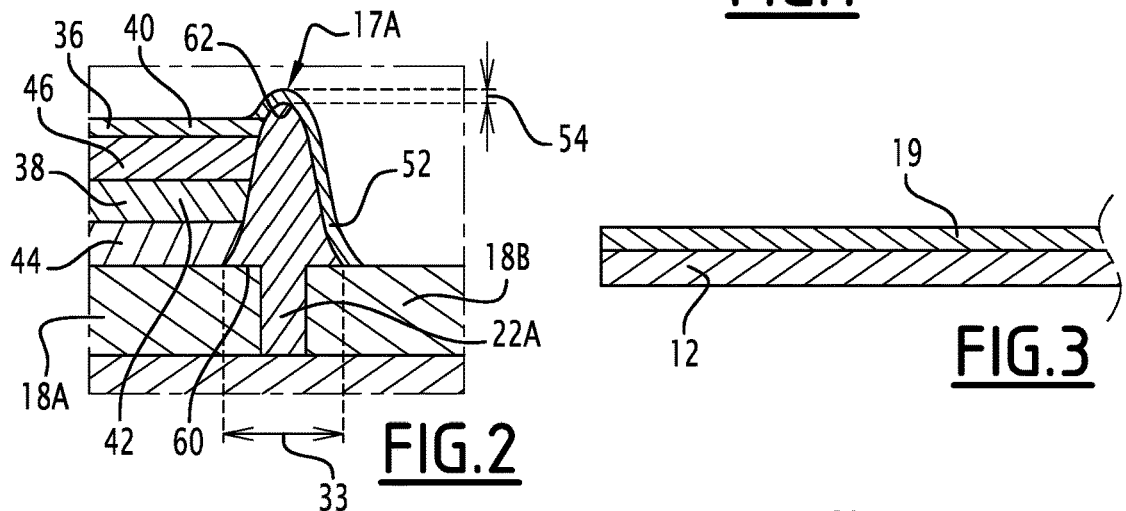
FIG.2
FIG.3
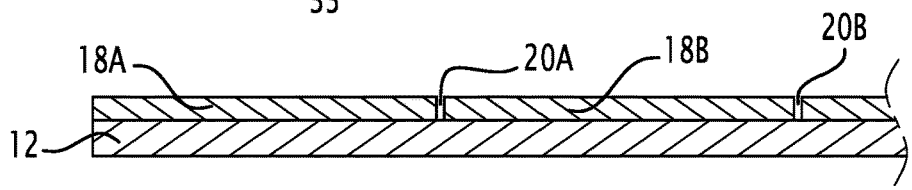
FIG.4
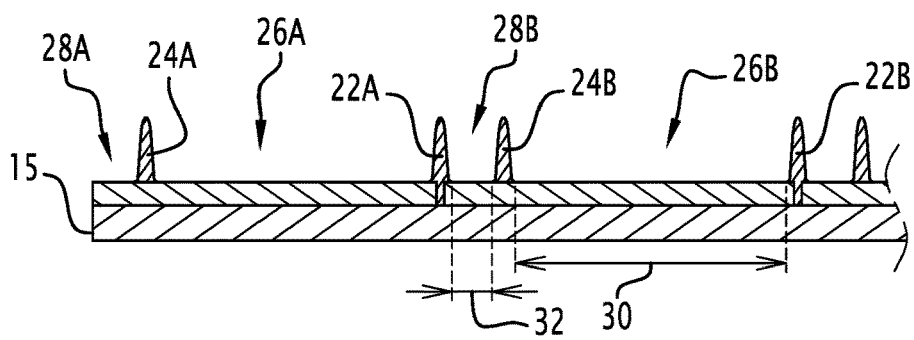
FIG.5
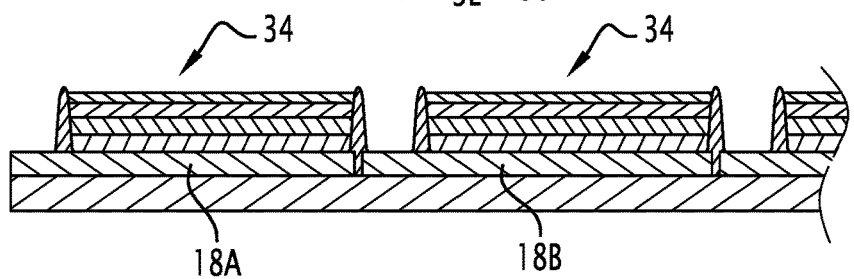
FIG.6

METHOD FOR MANUFACTURING A PHOTOVOLTAIC MODULE AND PHOTOVOLTAIC MODULE THUS OBTAINED

CROSS-REFERENCE TO RELATED APPLICATIONS

The present application is a non-provisional application claiming the benefit of FR 16 62616, filed Dec. 16, 2016, which is incorporated herein by reference in its entirety.

FIELD OF THE INVENTION

The present invention relates to a method for manufacturing a photovoltaic module, of the type comprising at least two electrically connected photovoltaic cells, the method comprising the following steps: providing an electrically insulating substrate covered with a layer of a first electrically conducting material; then forming, on said layer, at least one furrow defining first and second lower electrodes, electrically isolated from one another by said furrow; then forming, on each of said lower electrodes, a stack comprising at least: an upper electrode formed by a layer of a second electrically conducting material; and a layer of a photo-active material positioned between the lower and upper electrodes, each of the first and second lower electrodes respectively forming a first and second photovoltaic cell with the corresponding stack; then forming an electrical connection between the upper electrode of the first photovoltaic cell and the second lower electrode.

BACKGROUND OF THE INVENTION

A photovoltaic module is an electronic component which, exposed to light, produces electricity. Such a photovoltaic module typically comprises several electrically connected photovoltaic cells. Each cell includes at least one photo-active material, i.e., able to produce electricity from light. Such a material is for example an organic semiconductor.

A photovoltaic module of the aforementioned type is described in document U.S. Pat. No. 7,932,124. Each cell of such a photovoltaic module is formed by a stack of strips, including a photo-active layer between two electrodes, said stack of strips being positioned on a substrate.

Such a stack, called active area, is separated into adjacent active areas by a so-called inactive area. Said inactive area allows electric isolation of the lower electrodes of two adjacent cells while connecting the upper electrode of each cell to the lower electrode of an adjacent cell. A photovoltaic module is obtained by forming several cells thus connected in series.

Generally, in large-scale production methods, the layers of stacks are made using a wet method, i.e., by depositing a liquid formulation followed by a passage to the solid state.

The performance of the photovoltaic module in particular involves producing the narrowest possible inactive areas, to maximize the size of the active areas. However, the rheological and wettability properties of the formulations, as well as the physical properties of the substrates, impose minimum widths for the inactive areas. In particular, wet depositions cause edge effects on the strips.

The layers of the stack forming each cell in document U.S. Pat. No. 7,932,124 are in particular made with decreasing widths, so as to arrange a stair-stepped lateral offset. Such a production method makes it more complex to implement through large-scale production methods and contributes to decreasing the size of the active areas.

SUMMARY OF THE INVENTION

The present invention aims to propose a method for manufacturing a photovoltaic module in particular making it possible to minimize the size of the inactive areas and to maximize that of the active areas.

To that end, the invention relates to a manufacturing method of the aforementioned type, comprising the following steps, between the step for forming the furrow and the stacking step: forming a first electrically insulating strip in the furrow and above said furrow, said strip forming a relief relative to the first and second lower electrodes; and forming a second electrically insulating strip on the second lower electrode, said first and second electrically insulating strips being substantially parallel and delimiting an inactive area on said second lower electrode. Furthermore, the stack formed on the second photovoltaic cell is positioned outside the inactive area.

According to other advantageous aspects of the invention, the method includes one or more of the following features, considered alone or according to all technically possible combinations:

- a width of the inactive area is comprised between 0.1 mm and 2 mm;
- the method further comprises, between the step for forming the furrow and that of the stacking, the following steps: forming a third electrically insulating strip on the first lower electrode, the first and third electrically insulating strips being substantially parallel, the stack next formed on the first lower electrode being positioned between said first and third electrically insulating strips.
- at least the first electrically insulating strip is formed by deposition, on the furrow and on the first electrically conducting material, of a first liquid formulation of insulating material, followed by a passage to the solid state of said first formulation;
- the layer of the first electrically conducting material covering the substrate has a first surface energy; and the deposition of the first liquid formulation creates a first interface with said first electrically conducting material, the first surface tension of said first interface being lower than said first surface energy; a difference between said first surface energy and said first surface tension preferably being comprised between 0.015 N.m$^{-1}$ and 0.025 N.m$^{-1}$;
- the step for forming an electrical connection comprises depositing a layer of a third electrically conducting material between the upper electrode of the first photovoltaic cell and the second lower electrode of the second photovoltaic cell, above the first electrically insulating strip;
- the first electrically insulating strip has a second surface energy; and the third layer of electrically conducting material is formed by depositing a second liquid formulation, creating a second interface with said first electrically insulating strip, a second surface tension of said second interface being lower than said second surface energy; a difference between said second surface energy and said second surface tension preferably being greater than 0.015 N.m$^{-1}$;
- the first liquid formulation of insulating material comprises at least one polymer and at least one surfactant, the at least one polymer preferably being prepared with a base of compounds chosen from among amines, acrylates, epoxides, urethanes and mixtures thereof, and the at least one surfactant preferably being a fluorinated compound;

at least one of the layers of second electrically conducting material and photo-active material is formed by a coating or printing technique using a continuous wet method, preferably chosen from among slot-die, photogravure, flexography and rotary serigraphy;

the step for forming an electrical connection is carried out at the same time as the deposition of the layer of the second electrically conducting material, the third electrically conducting material being identical to said second electrically conducting material.

the upper electrode and the electrical connection are formed from an electrically conducting material transparent to visible light;

a thickness of the layer of third electrically conducting material is smaller than 1 µm and preferably smaller than 600 nm.

The invention further relates to a photovoltaic module derived from or able to be derived from a method as described above.

According to one advantageous aspect of the invention, said module is such that a ratio between the sum of areas of the stacks comprising a layer of photo-active material and a total area of the substrate is greater than 80%, and preferably greater than 85%.

BRIEF DESCRIPTION OF THE DRAWINGS

The invention will be better understood upon reading the following description, provided solely as a non-limiting example and done in reference to the drawings.

FIG. 1 is a sectional schematic view of a photovoltaic module according to one embodiment of the invention.

FIG. 2 is a detail view of the photovoltaic module of FIG. 1.

FIGS. 3 to 6 schematically show the steps for manufacturing the photovoltaic module of FIG. 1, using a method according to one embodiment of the invention.

DETAILED DESCRIPTION OF THE INVENTION

FIG. 1 is a sectional view of a photovoltaic module 10 according to one embodiment of the invention.

The photovoltaic module 10 in particular includes a substrate 12, formed by a film of electrically insulating material that is transparent to visible light, in particular of the polymer type. The substrate 12 in particular includes a substantially planar surface 14, delimited by at least one edge 15.

An orthogonal base (X, Y, Z) is considered, the surface 14 forming a plane (X, Y).

The photovoltaic module 10 includes at least two photovoltaic cells 16A, 16B, 16C, positioned on the substrate 12. The photovoltaic module 10 further includes at least one electrical connection 17A, 17B between two photovoltaic cells.

Each of the photovoltaic cells 16A, 16B, 16C is formed by the stack of coated strips longitudinally along the direction Y. The length of the strips along Y can reach up to several hundreds of meters.

Preferably, the photovoltaic module 10 includes a plurality of photovoltaic cells 16A, 16B, 16C, for example a number of photovoltaic cells greater than three. The photovoltaic module 10 preferably includes four, nine or twenty photovoltaic cells in the form of strips, the number of cells not being restricted to these values.

The photovoltaic cells 16A, 16B, 16C are substantially identical and adjacent along the direction X. The adjacent cells are connected by an electrical connection 17A, 17B.

A first photovoltaic cell 16A is adjacent along X to an edge 15 of the substrate 12. A second photovoltaic cell 16B is positioned between the first 16A and a third 16C photovoltaic cells. Said second cell 16B is electrically connected to each of said first 16A and third 16C cells, respectively by a first 17A and a second 17B electrical connection.

The first 16A and second 16B photovoltaic cells will be described at the same time below. The third photovoltaic cell 16C, partially shown in FIG. 1, is considered to be identical to the second photovoltaic cell 16B.

Each photovoltaic cell 16A, 16B includes a lower electrode 18A, 18B in contact with the surface 14 of the substrate 12. The lower electrode 18A, 18B is formed by a layer of a first electrically conducting material 19, transparent to visible light. For example, the lower electrode 18A, 18B has a width along X comprised between 10 mm and 20 mm.

Each lower electrode 18A, 18B is separated from the one or two adjacent lower electrodes by a furrow 20A, 20B extending along Y. For example, the first 18A and second 18B lower electrodes of the first 16A and second 16B photovoltaic cells are separated by the furrow 20A; the second lower electrode 18B is delimited along X by the furrow 20A and 20B.

A bottom of the furrow 20A, 20B is formed by the electrically insulating substrate 12. Thus, each furrow 20A, 20B electrically insulates the lower electrodes situated on either side of said furrow.

The lower electrodes 18A, 18B have a thickness along Z preferably smaller than 1 µm. More preferably, said thickness is comprised between 50 and 500 nm.

Each photovoltaic cell 16A, 16B further includes a first 22A, 22B and a second 24A, 24B electrically insulating strip, extending along Y. Each of said electrically insulating strips forms a relief along Z relative to the lower electrodes 18A, 18B.

Each first electrically insulating strip 22A, 22B extends in a furrow 20A, 20B and above said furrow. Each second electrically insulating strip 24A, 24B extends away from the furrows 20A, 20B. Thus, each second electrically insulating strip 24A, 24B separates the corresponding lower electrode 18A, 18B into two areas 26A, 26B and 28A, 28B, adjacent along X.

A first area 26A, 26B is called "active area" and a second area 28A, 28B is called "inactive area". In FIG. 1, each of the active areas 26A and 26B of the first 16A and second 16B photovoltaic cells, respectively, is respectively comprised between the first strip 22A and the second strip 24A, and between the first strip 22B and the second strip 24B.

The inactive area 28B (FIG. 5) of the second photovoltaic cell 16B is comprised between the first strip 22A, separating the first 16A and second 16B photovoltaic cells, and the second strip 24B. The inactive area 28A of the first photovoltaic cell 16A is comprised between the edge 15 of the substrate 12 and the second strip 24A.

A width 30 along X of the active area 26A, 26B (FIG. 5) is larger than a width 32 along X of the inactive area 28A, 28B. Preferably, the width 32 of the inactive area 28B of the second photovoltaic cell 16B is comprised between 0.1 mm and 2.0 mm, more preferably comprised between 0.5 mm and 1.5 mm. Preferably, the widths 30 of the active areas 26A and 26B of the photovoltaic cells 16A and 16B are comprised between 10 mm and 15 mm, more preferably comprised between 11 mm and 14 mm.

For information, a width 33 (FIG. 2) along X of each electrically insulating strip 22A, 22B, 24A, 24B is comprised between 0.2 m and 1 mm.

At the active area 26A, 26B, each photovoltaic cell 16A, 16B includes a stack 34 of layers of materials. The stack 34, or active area, comprises at least an upper electrode 36 and a photo-active layer 38.

The upper electrode 36 is formed by a layer of a second electrically conducting material 40, in particular made from metal, preferably transparent to visible light. It for example involves an ink with a base of silver nanoparticles or silver nanowires.

The photo-active layer 38, positioned between the lower 18A, 18B and upper 36 electrodes, is made up of a photo-active material 42. The photo-active material 42 is semiconductive. It is preferably an organic semiconductor. Advantageously, the photo-active material 42 is made up of a mixture of an electron donor material, called p material, and an electron acceptor material, called n material. The photo-active material 42 is for example a close mixture, on a nanometric scale, of said p and n materials. Alternatively, the photo-active layer 38 can be a heterojunction of a p material and a n material, in the form of a layer or a stack of several layers.

In the embodiment of FIG. 1, the active area 34 further includes a first 44 and second 46 interface layer, playing an electron transport role or serving as vias between the electrodes 18A, 18B, 36 and the photo-active layer 38. Each interface layer 44, 46 is positioned between said photo-active layer 38 and one of the lower 18A, 18B or upper 36 electrodes.

Each of the different layers of the active area 34 preferably has a thickness along Z of less than 5 μm, more preferably less than 1 μm.

The geometric fill factor (GFF) of the photovoltaic module 10 is considered. The GFF is defined as a ratio between the sum of the areas of the active areas 34 of the photovoltaic cells 16A, 16B, 16C and a total area of the substrate 12. The higher the GFF is, the better the electrical performance of the photovoltaic module 10 is.

Obtaining a high GFF in particular requires mastering the geometry of the electrical connections 17A, 17B, as described below.

The first electrical connection 17A connects the upper electrode 36 of the first photovoltaic cell 16A and the second lower electrode 18B. FIG. 2 shows a detail view of the photovoltaic module 10, at said first electrical connection 17A.

The first electrical connection 17A is formed by a layer of a third electrically conducting material 52. Said layer is positioned above the first electrically insulating strip 22A and electrically connects the upper electrode 36 of the first photovoltaic cell 16A to the inactive area 28B of the second lower electrode 18B.

Preferably, a thickness 54 of said layer of the material 52 is substantially homogenous along the level difference formed by the first electrically insulating strip 22A. Indeed, an overly variable thickness may cause an interruption in the electrical connectivity between two adjacent cells.

Preferably, said thickness 54 is smaller than 5 μm, more preferably smaller than 1 μm and still more preferably smaller than 600 nm.

Preferably, the third electrically conducting material 52 is substantially identical to the second electrically conducting material 40.

The second electrical connection 17B is positioned similarly to the first electrical connection 17A, between the second 16B and third 16C photovoltaic cells.

A method for manufacturing the photovoltaic module 10 above will now be described, based on FIGS. 3 to 6.

First (FIG. 3), the substrate 12 is provided covered with a layer of the first electrically conducting material 19. Said material 19 is for example deposited on the surface 14 of the substrate 12 by coating of the solid surface type.

The furrows 20A, 20B are next formed on said layer of material 19 (FIG. 4), in particular by mechanical or laser etching. Said furrows define the lower electrodes 18A, 18B electrically insulated from one another.

The first 22A, 22B and second 24A, 24B electrically insulating strips are next formed (FIG. 5) on said lower electrodes 18A, 18B, defining the active areas 26A, 26B and the inactive areas 28A, 28B. As will be described later, the electrically insulating strips are formed by depositing a liquid formulation of insulating material, followed by a passage to the solid state of said formulation.

Each of the first 22A, 22B electrically insulating strips makes it possible to complete the electrical insulation between the adjacent photovoltaic cells. Indeed, the formation of an electrically insulating strip in a furrow 20A, 20B makes it possible to minimize any short-circuits between the adjacent lower electrodes 18A, 18B. Such short-circuits are in particular caused by debris generated during the formation of the furrow by etching.

A stack 34 of layers of materials is next produced (FIG. 6) at the active area 26A, 26B of each lower electrode 18A, 18B. Each layer can be formed owing to a wide range of techniques. The manufacturing methods compatible with large-scale production are preferably continuous methods, such as the scrolling or roll-to-roll methods.

Wet scrolling methods, i.e., deposition in the liquid state, are divided into several categories: printing methods make it possible to create high-resolution patterns; coating methods comprise depositing material over the entire width or entire surface, with no pattern.

Printing methods in particular comprise flexography, heliography, photogravure, offset printing, serigraphy and inkjet printing. Coating methods in particular comprise slot-die, curtain coating, and knife coating.

Each of the different layers 36, 38, 44, 46 of the stacks 34 is preferably formed by a wet scrolling coating or printing technique, in particular chosen from among slot-die, photogravure, serigraphy and flexography.

The electrically insulating strips form a physical border between the active and inactive areas of each lower electrode. This border facilitates the formation of stacks 34 by successive layers, by controlling the definition of the edges of said layers. In particular, the presence of the electrically insulating strips makes it possible to avoid the lateral offset of the layers, in a stair-stepped manner, as described in document U.S. Pat. No. 7,932,124.

In the case of printing or coating by machines comprising driving rollers, such as for flexography, heliography, photogravure, serigraphy and slot-die, the electrically insulating strips also form a physical protection along the axis the of the coated surface. Such a protection makes it possible to limit the formation of defects on the various coated layers, by the contact between the driving rollers and the substrate to be coated.

The various photovoltaic cells 16A, 16B, 16C are thus obtained. Said photovoltaic cells are electrically isolated from one another, as shown in FIG. 6.

A final step of the manufacturing method comprises forming electrical connections 17A, 17B, by depositing a layer of the third electrically conducting material 52 above the first electrically insulating strips 22A, 22B.

The photovoltaic module 10 of FIG. 1 is thus obtained.

Preferably, the formation of the electrical connections 17A, 17B and the deposition of the layer 36 are done at the same time. In this case, the third electrically conducting material 52 is identical to the second electrically conducting material 40. Preferably, a thickness 54 of said third material is then substantially identical to the thickness of the layer 36.

The third electrically conducting material 52 is preferably obtained by a wet scrolling coating or printing technique, i.e., by depositing a liquid formulation, followed by a passage to the solid state of said formulation. During this step, it is desirable to obtain the smallest possible thickness 54, in particular of about 1 μm, to minimize the wet contact of said formulation with the layer previously deposited. Indeed, such contact may lead to the re-dissolution of the lower layers and the diffusion of the solvents and materials through the lower layers. This results in stray resistances and electrical short-circuits.

Furthermore, a small thickness 54 makes it possible to limit the edge effects with the first 22A and second 24B electrically insulating strips, during wet coating of the electrical connection 17A. It is thus possible to minimize the width 32 of the inactive areas 28B of the photovoltaic cells, which leads to an optimization of the GFF.

Furthermore, as previously indicated, it is desirable to obtain a homogeneous thickness 54 at the level difference generated by the insulating strip in order to ensure the continuity of the electrical conductivity. Yet the traditional scrolling deposition methods such as slot-die, heliogravure or flexography are often unsuitable for obtaining a homogeneous thickness of the non-planar surfaces, such as the insulating strips.

Gaseous-phase coating methods, such as chemical or physical evaporation deposition methods, are known to make it possible to obtain a layer with a homogeneous thickness on nonplanar surfaces. Such methods are, however, not very compatible with the industrial production of photovoltaic modules having large surface areas, in particular since they generate too many material losses.

Serigraphy methods, which make it possible to coat inks with a base of silver metal particles, are also known. However, the homogeneity is established by coated thicknesses generally exceeding 5 μm, which is too high relative to the targeted thicknesses 54.

According to one preferred embodiment of the invention, the method for forming the layer of the third electrically conducting material 52 makes it possible to verify the value and the homogeneity of the thickness 54. Said method involves mastering the surface tensions of the various formulations deposited in the liquid state.

The surface tension is defined as the energy necessary to modify the form of an interface established between the molecules of a first liquid and those of a second liquid or of a gaseous substance that is insoluble in the first liquid. The surface tension is measured in newtons per meter ($N.m^{-1}$). The surface tension of a liquid on a solid substrate, or surface tension, can be measured using a tensiometer or goniometer. The tension is determined using an ideal probe, allowing perfect wetting irrespective of the studied liquids, said probe being suspended from a precision scale.

The absence of mobility of the molecules of a solid does not make it possible, like for a liquid, to determine its surface tension directly. The surface tension of a solid, or surface energy, can be measured indirectly by measuring the contact angles with different reference liquids. The contact angles make it possible to model the angle formed, with a given surface, by a drop of three standard pure liquids having a dispersive part and a polar part. The usable reference liquids are in particular thiodiglycol, ethylene glycol and diiodomethane.

According to the preferred embodiment of the method previously described, the first insulating strip 22A is produced by coating, with the first liquid formulation, insulating materials on the lower electrodes 18A, 18B and the furrow 20A, followed by drying. The first formulation for example comprises polymers prepared from materials such as amines, acrylates, epoxides, urethanes, phenoxys or combinations thereof. These insulating materials are deposited in solution, or without solvent when they are in liquid state at ambient temperature.

The layer of the first electrically conducting material 19 covering the substrate 12 has a first surface energy $\gamma_{S1}$. The deposition of the first liquid formulation creates a first interface 60 (FIG. 2) with said first material 19. Said first interface has a first surface tension $T_{S1}$, lower than said first surface energy $\gamma_{S1}$. Preferably, a difference between said first surface tension $T_{S1}$ and said first surface energy $\gamma_{S1}$ is comprised between 0.015 $N.m^{-1}$ and 0.025 $N.m^{-1}$.

The first formulation is then solidified by thermal drying to form the first insulating strip 22A. In the solid state, said first strip has a second surface energy $\gamma_{S2}$.

After producing the stack or active area 34, the third electrically conductive material 52 is deposited in the form of a second liquid formulation. Said second liquid formulation includes at least one conducting material, which may be chosen from among: electrically conducting metals and alloys, in particular gold, silver, copper, aluminum, nickel, palladium, platinum and titanium; conducting polymers such as polythiophenes, polyanilines, polypyrroles; and metal oxides such as indium and tin oxide, fluorinated tin oxide, tin oxide and zinc oxide.

The deposition of the second liquid formulation creates a second interface 62 with the first insulating strip 22A. A second surface tension $T_{S2}$ of said second interface is lower than the second surface energy $\gamma_{S2}$. Preferably, a difference between said second surface energy $\gamma_{S2}$ and said second surface tension $T_{S2}$ is greater than 0.015 $N.m^{-1}$.

The second formulation is then solidified by thermal drying to form the first electrical connection 17A, in the form of a layer of material 52.

The maintenance of the surface energies $\gamma_{S1}$, $\gamma_{S2}$ and surface tensions $T_{S1}$, $T_{S2}$ in the ranges described above can be obtained by incorporating at least one additive of the surfactant type into the first liquid formulation of insulating materials. The choice of the surfactant is determined by its ability to reduce the surface tension $T_{S1}$ of the first liquid formulation without decreasing the surface energy $\gamma_{S2}$ of the solid strip formed after drying.

The surfactant-type additive is preferably a fluorinated surfactant, and more preferably an ethoxylated non-ionic fluorinated surfactant agent.

Keeping the surface energies $\gamma_{S1}$, $\gamma_{S2}$ and surface tensions $T_{S1}$, $T_{S2}$ in the ranges described above makes it possible to obtain a substantially homogeneous thickness 54 less than or equal to 1 μm. The preferred embodiment described above in particular makes it possible to minimize the width 32 of the inactive areas 28B of the photovoltaic cells. A GFF greater than 80%, or even greater than 85%, can in particular be obtained for the photovoltaic module 10.

The following examples illustrate the invention without limiting its scope.

EXAMPLE 1

Formation of the First Insulating Strip 22A

The substrate 12 is a polyethylene terephthalate plastic film. The lower electrodes 18A, 18B are formed by deposition on said substrate of a fine layer of indium tin oxide (ITO) as first electrically conducting material 19, then by etching furrows 20A, 20B.

The first surface energy $\gamma_{S1}$ of the lower electrodes 18A, 18B is measured using a goniometer, the 3 reference liquids being diiodomethane, ethylene glycol and thiodiglycol. The first surface energy $\gamma_{S1}$ thus measured is comprised between 38 and 45 mN/m.

In parallel, the first liquid formulation is prepared to produce the first insulating strip 22A. Several examples of formulations E, F, G and H are shown in Table 1 below:

TABLE 1

| Compound | Formulation E | | Formulation F | | Formulation G | | Formulation H | |
|---|---|---|---|---|---|---|---|---|
| | Mass [g] | % | Mass [g] | % | Mass [g] | % | Mass [g] | % |
| phenoxy resin | 2.379 | 23.79 | 2.378 | 23.78 | 2.378 | 23.78 | 2.373 | 23.73 |
| cross-linking isocyanate | 0.097 | 0.97 | 0.097 | 0.97 | 0.097 | 0.97 | 0.097 | 0.97 |
| butan-2-one | 7.519 | 75.19 | 7.515 | 75.15 | 7.515 | 75.15 | 7.500 | 75.00 |
| surfactant A | 0.005 | 0.05 | 0.010 | 0.10 | — | — | — | — |
| surfactant B | — | — | — | — | 0.010 | 0.10 | 0.030 | 0.30 |

Formulations E, F, G and H are prepared as follows: Weigh PKHP-80 and surfactant; add solvent; homogenize for 1 night on a roller-type agitator; add BI7963; homogenize for 1 hour on the roller-type agitator.

A first insulating strip 22A is next formed by coating each of formulations E, F, G and H on lower electrodes 18A, 18B as described above. The coatings are done with an automatic applicator (AAF) by the company Erichsen according to the following parameters: speed: 10 mm/s; slot: 50 μm; volume: 600 μL.

The first surface tension $T_{S1}$ of the formulations is measured on the lower electrodes, using a Krüss K100 tensiometer. The measurements of $T_{S1}$ for the various formulations are shown in Table 2.

TABLE 2

| | $T_{S1}$ (mN/m) | Value of $\gamma_{S1}$ − 25 mN/m | Value of $\gamma_{S1}$ − 15 mN/m |
|---|---|---|---|
| Formulation E | 17.1 | Between 13 and 20 | Between 23 and 30 |
| Formulation F | 15.3 | | |
| Formulation G | 7.5 | | |
| Formulation H | 12.8 | | |

Drying for 2 minutes at 120° C. in an oven is next done. Solid insulating strips called E, F, G and H are thus obtained.

The second surface energy $\gamma_{S2}$ of the insulating strips E, F, G and H is next measured by the goniometer, according to the method described above for the first surface energy. The various surface energies thus measured are shown in Table 3 of Example 2 below.

EXAMPLE 2

Formation of the First Insulating Strip 17A

A second liquid formulation is obtained to produce the first electrical connection 17A. The second liquid formulation comprises a conducting material of the silver-based ink type.

A layer of second liquid formulation is next coated on each of the insulating strips E, F, G and H. Coating of the second liquid formulation is done with the automatic film applicator (AAF) by Erichsen. The deposited volume and the slots vary based on the tests (tested slots 12.5 μm and 50 μm).

The second surface tension $T_{S2}$ of the second liquid formulation is measured on each of the insulating strips E, F, G and H, using a Krüss K100 tensiometer. In all cases, the second surface tension $T_{S2}$ is comprised between 21.5 and 21.9 mN/m.

The measurements of $\gamma_{S2}$ for the various insulating strips are shown in Table 3:

TABLE 3

| | $\gamma_{S2}$ (mN/m) | Value of $T_{S2}$ + 15 mN/m |
|---|---|---|
| insulating strip E | 39.64 | 36.5 |
| insulating strip F | 40.18 | |
| insulating strip G | 28.39 | |
| insulating strip H | 18.46 | |

Conclusion

The first surface tensions $T_{S1}$ of formulations G and H are not comprised between the values ($\gamma_{S1}$−25 mN/m) and ($\gamma_{S1}$−15 mN/m). Likewise, the second surface energies $\gamma_{S2}$ of insulating strips G and H are below the value ($T_{S2}$+15 mN/m).

Formulations G and H and the insulating strips derived from these formulations respectively have excessively low surface tensions and surface energies. The formation of the electrical connection 17A on an insulating strip 22A derived from formulations G and H leads to poor homogeneity of the layer of conducting material 52, which can cause a break in the electrical connection between the photovoltaic cells 16A and 16B.

Experimentally, the electrical resistance measured on the electrodes 36, 18B, on either side of the insulating strip 22A covered by the electrical connection 17A, is greater than 100Ω. This resistance causes a loss of the electrical connection between the two cells 16A and 16B. The photovoltaic module 10 thus obtained is therefore not functional.

On the contrary, formulations E and F and the insulating strips derived from these formulations respectively have surface tensions and surface energies in the desired range. The formation of the electrical connection 17A on an insulating strip 22A derived from formulations E and F leads to a homogeneous layer of conducting material 52, therefore a good electrical connection between the photovoltaic cells 16A and 16B. The photovoltaic module 10 thus obtained is functional.

The invention claimed is:

1. A method for manufacturing a photovoltaic module, comprising at least two electrically connected photovoltaic cells, the method comprising the following steps:
   a) providing an electrically insulating substrate covered with a layer of a first electrically conducting material;
   b) forming, on said layer, at least one furrow defining first and second lower electrodes, electrically isolated from one another by said furrow;
   c) forming, on each of said lower electrodes, a stack comprising at least: an upper electrode formed by a layer of a second electrically conducting material, and a layer of a photo-active material positioned between the lower and upper electrodes, wherein each of the first and second lower electrodes respectively forming a first and second photovoltaic cell with the corresponding stack; and
   d) forming an electrical connection between the upper electrode of the first photovoltaic cell and the second lower electrode;
   the method being characterized in that it comprises the following steps, between steps b) and c):
   e) forming a first electrically insulating strip in the furrow and above said furrow, said strip forming a relief relative to the first and second lower electrodes; and
   f) forming a second electrically insulating strip on the second lower electrode, said first and second electrically insulating strips being substantially parallel and delimiting an inactive area on said second lower electrode;
   in that the stack formed in step c) on the second photovoltaic cell is positioned outside the inactive area.

2. The method according to claim 1, wherein a width of the inactive area is comprised between 0.1 mm and 2 mm.

3. The method according to claim 1, wherein:
   at least the first electrically insulating strip is formed by deposition, on the furrow and on the first electrically conducting material, of a first liquid formulation of insulating material, followed by a passage to the solid state of said first formulation;
   the layer of the first electrically conducting material covering the substrate has a first surface energy ($\gamma_{S1}$);
   the deposition of the first liquid formulation creates a first interface with said first electrically conducting material, the first surface tension ($T_{S1}$) of said first interface being lower than said first surface energy ($\gamma_{S1}$); and
   a difference between said first surface energy and said first surface tension preferably being comprised between 0.015 N.m$^{-1}$ and 0.025 N.m$^{-1}$.

4. The method according to claim 1, wherein step d) comprises depositing a layer of a third electrically conducting material between the upper electrode of the first photovoltaic cell and the second lower electrode of the second photovoltaic cell, above the first electrically insulating strip.

5. The method according to claim 4, wherein:
   the first electrically insulating strip has a second surface energy ($\gamma_{S2}$);
   the third layer of electrically conducting material is formed by depositing a second liquid formulation, creating a second interface with said first electrically insulating strip, a second surface tension ($T_{S2}$) of said second interface being lower than said second surface energy ($\gamma_{S2}$);
   a difference between said second surface energy and said second surface tension preferably being greater than 0.015 N.m$^{-1}$.

6. The method according to claims 3, wherein the first liquid formulation of insulating material comprises at least one polymer and at least one surfactant,
   the at least one polymer preferably being prepared with a base of compounds chosen from among amines, acrylates, epoxides, urethanes and mixtures thereof, and
   the at least one surfactant preferably being a fluorinated compound.

7. The method according to claim 1, wherein at least one of the layers of second electrically conducting material and photo-active material is formed by a coating or printing technique using a continuous wet method, preferably chosen from among slot-die, photogravure and flexography.

8. The method according to claim 1, wherein step d) is carried out at the same time as the deposition of the layer of the second electrically conducting material of step c), the third electrically conducting material being identical to said second electrically conducting material.

9. The method according to claim 1, wherein the upper electrode and the electrical connection are formed from an electrically conducting material transparent to visible light.

10. The method according to claim 4, wherein a thickness of the layer of third electrically conducting material is smaller than 1 μm and preferably smaller than 600 nm.

* * * * *